United States Patent
Lu et al.

(10) Patent No.: US 9,064,705 B2
(45) Date of Patent: Jun. 23, 2015

(54) METHODS AND APPARATUS OF PACKAGING WITH INTERPOSERS

(71) Applicant: Taiwan Semiconductor Manufacturing Company, Ltd., Hsin-Chu (TW)

(72) Inventors: Chung-Yu Lu, Hsin-Chu (TW);
Hsien-Pin Hu, Zhubei (TW);
Hsiao-Tsung Yen, Tainan (TW);
Tzuan-Horng Liu, Longtan Township (TW); Shih-Wen Huang, Shuishang Township (TW); Shang-Yun Hou, Jubei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 13/713,020

(22) Filed: Dec. 13, 2012

(65) Prior Publication Data

US 2014/0167269 A1    Jun. 19, 2014

(51) Int. Cl.
*H01L 23/48* (2006.01)
*H01L 25/04* (2014.01)
*H01L 25/00* (2006.01)
*H01L 25/065* (2006.01)

(52) U.S. Cl.
CPC ................ *H01L 25/04* (2013.01); *H01L 25/50* (2013.01); *H01L 25/0652* (2013.01); *H01L 2924/0002* (2013.01)

(58) Field of Classification Search
CPC ...... H01L 25/04; H01L 25/50; H01L 25/0652
USPC .................................................. 257/737, 777
See application file for complete search history.

(56) References Cited

U.S. PATENT DOCUMENTS

| 7,402,901 | B2 | 7/2008 | Hatano et al. | |
| 8,227,904 | B2 | 7/2012 | Braunisch et al. | |
| 2012/0077314 | A1 | 3/2012 | Park et al. | |
| 2012/0126417 | A1* | 5/2012 | Chiu | 257/774 |
| 2013/0200511 | A1* | 8/2013 | Banijamali | 257/737 |

FOREIGN PATENT DOCUMENTS

| KR | 10-2006-0100263 | 9/2006 |
| KR | 10-2012-0018810 | 3/2012 |
| KR | 10-2012-0032254 | 4/2012 |

* cited by examiner

*Primary Examiner* — Long K Tran
(74) *Attorney, Agent, or Firm* — Slater & Matsil, L.L.P.

(57) ABSTRACT

Methods and apparatus for forming a semiconductor device package on an interposer using a micro-bump layer are disclosed. The micro-bump layer may comprise micro-bumps and micro-bump lines, where a micro-bump is used as a vertical connection between a die and the interposer, and a micro-bump line is used as a horizontal connection for signal transmission between different dies above the interposer. The micro-bump lines may be formed at the same time as the formation of the micro-bumps with little or no additional cost.

20 Claims, 8 Drawing Sheets

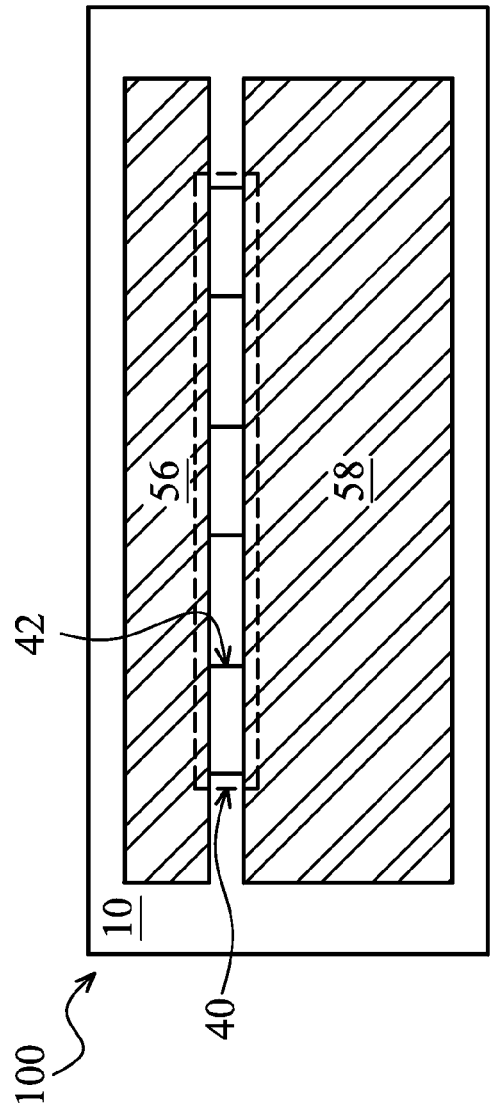
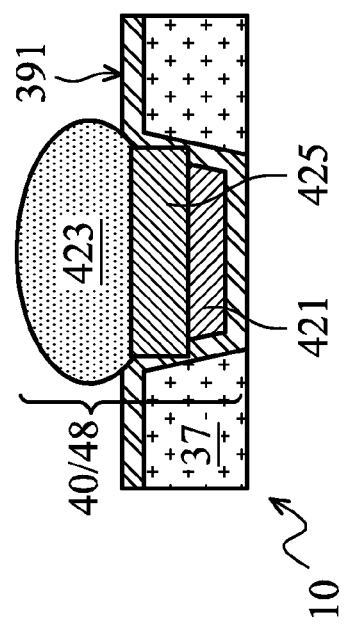
Figure 1(a)
Figure 1(b)

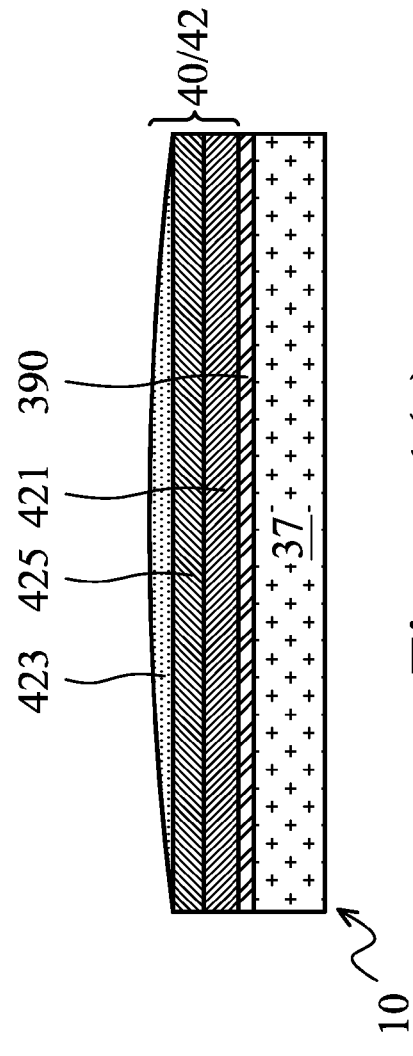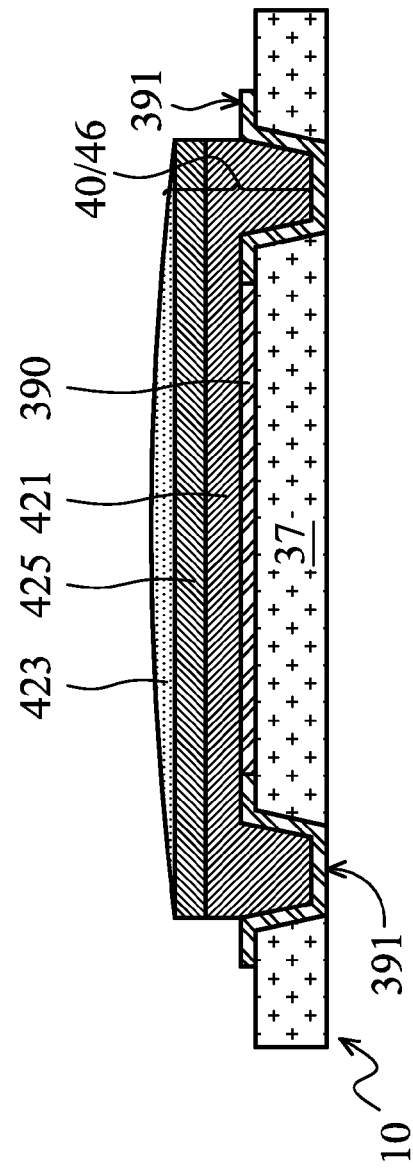

METHODS AND APPARATUS OF PACKAGING WITH INTERPOSERS

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. These smaller electronic components also require smaller packages that utilize less area than previous packages. Some smaller types of packages for semiconductor devices include quad flat pack (QFP), pin grid array (PGA), ball grid array (BGA), flip chips (FC), three dimensional integrated circuits (3DICs), wafer level packages (WLPs), and package on package (PoP) devices.

3DIC technologies are also known as vertical interconnect packaging technologies as they exploit the vertical dimension of the chip to reduce interconnect length and to achieve greater integration efficiency. The techniques for 3DIC package include wire-bonding, micro-bumps, through-vias, and more. A silicon interposer can be used to form a 3DIC package, where the interposer provides die-to-die interconnections for dies mounted on the interposer. For example, two dies may be bonded above each other with the lower die being coupled to the interposer by connectors such as micro-bumps. Alternatively, multiple dies may also be mounted in parallel above an interposer, and coupled to the interposer by connectors such as micro-bumps.

Signal integrity is an important issue for packaging. There are challenges for a 3DIC package formed on an interposer using metal layers inside the interposer to transmit signals between dies within the 3DIC package.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1(a)-1(d) illustrate cross-sectional views and a top view of packages formed with an interposer using a micro-bump layer, and details of the micro-bump layer, in accordance with some embodiments;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 2A:
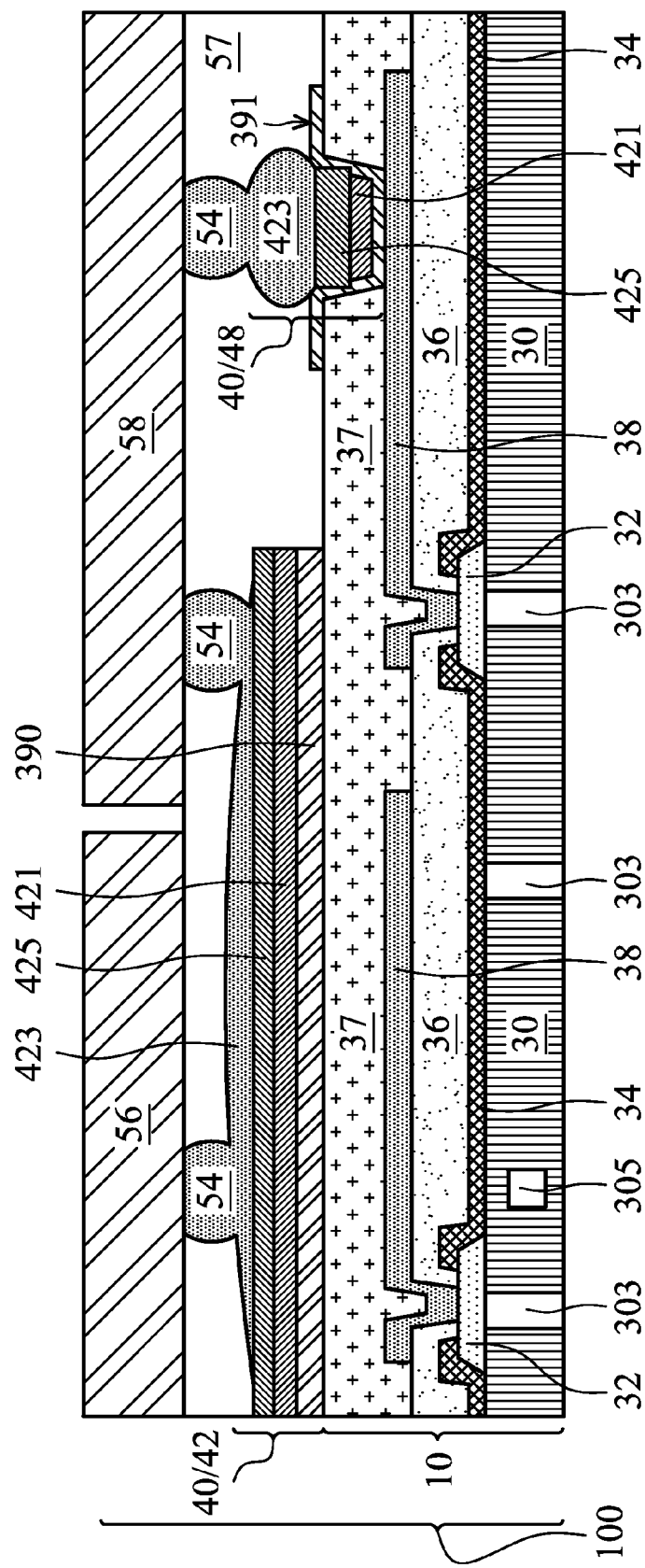
FIGS. 2(a)-2(b) illustrate cross-sectional views of packages formed with an interposer using a micro-bump layer in accordance with some embodiments.

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following, methods and apparatus for forming a semiconductor device package on an interposer using a micro-bump layer are disclosed. The micro-bump layer may comprise micro-bumps and micro-bump lines, where a micro-bump is used as a vertical connection between a die and the interposer, and a micro-bump line is used as a horizontal connection for signal transmission between different dies above the interposer. In addition, the micro-bump line formed above an interposer may be used to transfer signals within the interposer as well. Comparing to metal lines within the interposer, the micro-bump lines have much lower resistance and lower wiring density, therefore decrease interference and crosstalk, and improve signal integrity. The micro-bump lines may be formed at the same time as the formation of the micro-bumps with little or no additional cost.

As illustrated in FIG. 1(a), which is a simplified top view of a semiconductor device package 100 formed on an interposer 10. A first die 56 and a second die 58 are packaged above the interposer 10 and connected to the interposer 10. A micro-bump layer 40 provides a horizontal connection between the first die 56 and the second die 58. The micro-bump layer 40 comprises a plurality of micro-bump lines 42, as shown in FIG. 1(a). The micro-bump layer 40 may also comprise a plurality of micro-bumps and micro-bump lines transmitting signals within the interposers which are not shown in FIG. 1(a). Signals can be transmitted between the dies 56 and 58 directly through the micro-bump lines such as the micro-bump line 42 in the micro-bump layer 40, without going through the interposer 10. Comparing to conductive paths formed within the interposer 10, the micro-bump line 42 provides shorter paths for signal transmission between the dies 56 and 58, has lower resistance and lower wiring density, therefore decreases interference and crosstalk, and improves signal integrity between dies.

The interposer 10 may comprise a substrate (not shown), with through vias and devices formed within the substrate. The interposer 10 may further comprise a plurality of contact pads, passivation layers, insulator layers such as polymer layers, redistribution layers (RDL), and an under bump metal (UBM) layer above the substrate, which will be shown in FIG. 2(a). Alternatively, a package substrate may replace the illustrated interposer 10, wherein the package substrate has no through vias or devices, any or all of the layers described above.

The dies 56 and 58 may be integrated circuit (IC) chips formed from a semiconductor wafer. The dies 56 and 58 may be any suitable integrated circuit die for a particular application. For example, the dies 56 and 58 may be a memory chip, such as a DRAM, SRAM, NVRAM, or a logic circuit.

Figure 2B:
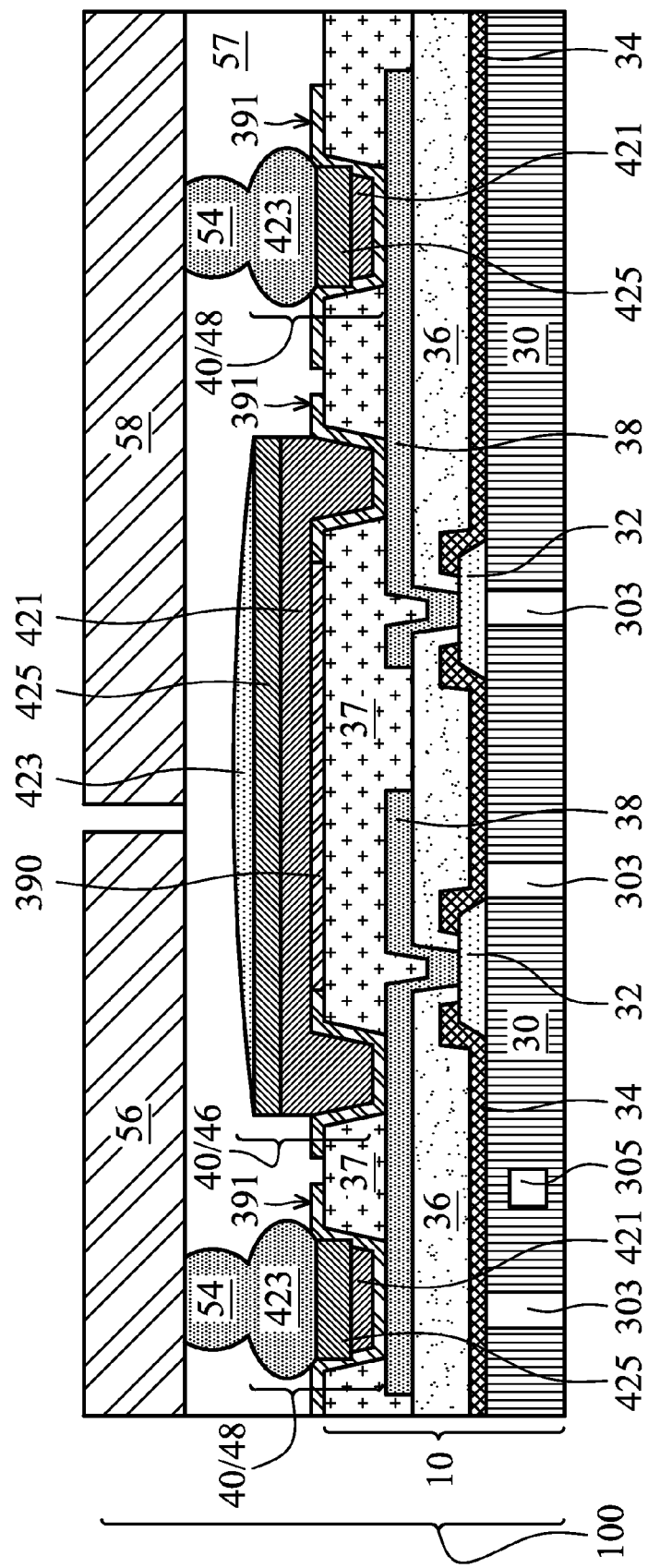

More details of the micro-bump layer 40 are illustrated in FIGS. 1(b)-1(d) in cross-section views. The micro-bump layer 40 may comprise a micro-bump 48 shown in FIG. 1(b), a micro-bump line 42 shown in FIG. 1(c), and a micro-bump line 46 shown in FIG. 1(d). The use of the micro-bump 48, the micro-bump lines 42 and 46 are illustrated in FIGS. 2(a)-2(b) when the package 100 is shown in more details. The micro-bump layer 40 may comprise a plurality of such micro-bumps 48, and micro-bump lines 42 and 46, among which only one of each is shown in FIGS. 1(b)-1(d). The micro-bump lines 42 and 46, and the micro-bump 48 may be formed at the same time with little or no additional cost, may be of a similar height, and may be made of similar materials. The height of the micro-bump layer 40 may be defined by the height of the micro-bump 48 or the height of the micro-bump lines 42 and 46, which may depend on the technology used in the package. For example, for current technology, the height of the micro-bump layer 40 may be within the range of about 5 μm to about 50 μm, such as about 27 μm.

As shown in FIG. 1(b), the micro-bump 48 may comprise a solder bump 423 formed above a Cu layer 421. An optional Ni layer 425 may be between the solder bump 423 and the Cu layer 421. The solder bump 423 may comprise an electrically conductive solder material, e.g., Sn, Ni, Au, Ag, Cu, bismuthinite (Bi) and alloys thereof, or combinations of other electrically conductive materials. For example, the solder bump 423 may be a Cu/SnAg solder bump. The micro-bump 48 may be formed by initially forming a Cu layer 421 through methods such as sputtering, evaporation, electroplating, printing, solder transfer, or ball placement, to a thickness of, e.g., about 15 μm, followed by forming a Ni layer 425, and finally followed by forming a solder layer 423 such as lead-free solder SnAg, formed in sequence using the same or similar method for each layer. Then a reflow is performed in order to shape the solder layer 423 into the desired bump shape shown as the solder bump 423. Any suitable method of producing the micro-bump 48 may alternatively be utilized. For example, the micro-bump 48 may be manufactured using the Controlled Collapse Chip Connection New Process (C4NP).

The micro-bump 48 may be placed on an UBM pad 391 of an interposer 10, such as the interposer 10 in FIG. 1(a). The micro-bump 48 provides a vertical connection between a die and the interposer 10 through the UBM pad 391, sometimes referred to herein as a contact pad. The UBM pad 391 may fill an opening or partially filling an opening of an insulator layer such as an insulator layer 37. The UBM pad 391 may be further connected to a metal layer or a contact under the UBM pad 391 within the interposer 10. The micro-bump 48 may be of a height size from about 5 μm to about 50 μm. With the continuous reduction of feature sizes and package sizes, the sizes in embodiments may become smaller than the ones described above. On the other hand, the micro-bump 48 may be of a bigger size such as a size of a flip-chip bump or a package bump as well, depending on the particular applications of interest.

As shown in FIG. 1(c), the micro-bump line 42 may be placed on an UBM layer 390 formed above the insulator layer 37 which is a part of the interposer 10 shown in FIG. 1(a). The micro-bump line 42 may provide a horizontal connection for signal transmission between different chips above the interposer. The electrical signals are transmitted through the micro-bump line 42 without going through the interposer. The insulator layer 37 under UBM layer 390 and micro-bump line 42 is not conductive, therefore signals in the micro-bump line 42 do not transmit into or through the interposer. The micro-bump line 42 may comprise a solder bump layer 423 formed above a Cu layer 421. An optional Ni layer 425 may be in between the solder bump layer 423 and the Cu layer 421.

Alternatively, as shown in FIG. 1(d), a micro-bump line 46 may be formed connecting two UBM pads 391 together, where both UBM pads 391 are within the interposer 10 shown in FIG. 1(a). The micro-bump line 46 may provide a connection for signals transmitting from one part of the interposer to another part of the interposer. Comparing to signal transmission within the interposer, such a micro-bump line 46 may also have lower resistance and lower wiring density, therefore decreasing interference and crosstalk, and improving signal integrity for signals transmitted within the interposer. The micro-bump line 46 may comprise a solder bump layer 423 formed above a Cu layer 421. An optional Ni layer 425 may be between the solder bump layer 423 and the Cu layer 421. There may be an UBM layer 390 formed above the insulator layer 37 and below the Cu layer 421. The UBM layer 390 may be formed at the same time as the UBM pads 391.

There may be a plurality of micro-bump lines similar to the micro-bump line 42 shown in FIG. 1(c), formed above the UBM layer 390, and connecting different dies horizontally. Similarly, there may be a plurality of micro-bump lines similar to the micro-bump line 46 shown in FIG. 1(d), transmitting signals within the interposer 10. The micro-bump lines 42 and 46 may be made of substantially similar materials as the materials used for the micro-bump 48. The micro-bump line 42 and 46 may comprise multiple layers. For example, the layer 421 above the UBM layer 390 may be a layer of Cu, the layer 425 above the layer 421 may be an optional layer of Ni, and the layer 423 above the layer 425 may be a layer of lead free solder such as SnAg, with Ag from about 1% to about 2%, and Sn from about 99% to about 98%. The height of the three layers 421, 425, and 423 may be about the same, or different, which can be varied according to different requirement. For example, a ratio of the heights for the layers 421 of Cu, 425 of Ni, and 423 of lead free solder may be around 15/1.5/10. The total height of the micro-bump line 42 may be within a range from about 5 μm to about 50 μm, e.g., 27 μm.

The micro-bump lines 42 and 46 may be of a rectangle shape with a width from around 5 μm to about 100 μm. The width of the micro-bump lines 42 and 46 may be about the same. The micro-bump lines 42 and 46 may have a narrow, wide, or tapered shape. The body of the micro-bump lines 42 and 46 may be of a substantially constant thickness. The micro-bump lines 42 and 46 may be of other shapes such as a circle, an octagon, a rectangle, an elongated hexagon with two trapezoids on opposite ends of the elongated hexagon, an oval, a diamond, in top views.

As illustrated in FIGS. 1(b)-1(d), the micro-bump lines 42 and 46, and the micro-bump 48 may be formed together as the micro-bump 48 is formed, by plating of a 421 layer of Cu, an optional 425 layer of Ni, and a 423 layer of lead free solder such as SnAg in sequence. Afterwards, the lead free solder layer 423 may be reflowed. The reflow process changes the shape of the solder layer 423 into a circular shape, but it would not affect the Cu layer 421 under the solder layer 423. The Cu layer 421 for the micro-bump lines 42 and 46 may be of a longer length than the length of the Cu layer 421 of the micro-bump 48, because the micro-bump lines 42 and 46 are used to make horizontal connections between two dies or two contact pads, and the micro-bump 48 is used to connect a die to the interposer in one location. Each layer may be formed using a deposition process, such as sputtering, evaporation, electroplating, printing, solder transfer, and more.

More details of the package 100 shown in FIG. 1(a) are illustrated in FIGS. 2(a)-2(b) in cross-section views. As illustrated in FIG. 2(a), a semiconductor device package 100 may be formed on the interposer 10. The interposer 10 may comprise: a substrate 30 with through vias (TV) 303 and devices 305, a plurality of contact pads 32, a passivation layer 34, an insulator layer 36, a RDL 38, another insulator layer 37, an UBM layer 390 and UBM pads 391 covering openings and on insulator layer 37.

The micro-bump layer 40 may be formed above the interposer 10. The micro-bump layer 40 comprises the micro-bump line 42 and the micro-bump 48. The micro-bump line 42 is on the UBM layer 390 of the interposer. However, the UBM layer 390 under the micro-bump line 42 is still above an insulator layer such as the insulator 37, therefore signal transmitted by the micro-bump line 42 is not transmitted into the interposer 10. The micro-bump 48 on the other hand is connected to the UBM pad 391, which is further connected to the devices and metal layers inside the interposer 10. The dies 56 and 58 may be placed above the interposer 10, connected to the micro-bump layer 40 by connectors 54 connected to the micro-bump line 42 and the micro-bump 48. An underfill 57 may fill the gap between the interposer 10 and the dies 56 and 58, covering the micro-bump line 42, the micro-bumps 48, and connectors 54. Each of these structures is discussed in greater detail in the following paragraphs.

Alternatively, in FIG. 2(b), the micro-bump layer 40 comprises the micro-bump line 46 and the micro-bumps 48. The micro-bump line 46 may be formed connecting two UBM pads 391 together, where both UBM pads 391 are within the interposer 10. The micro-bump line 46 may provide a connection for signals transmitting from one part of the interposer to another part of the interposer. Comparing to signal transmission within the interposer, such a micro-bump line 46 may also have lower resistance and lower wiring density, therefore decreasing interference and crosstalk, and improving signal integrity for signals transmitted within the interposer. The dies 56 and 58 may be placed above the interposer 10, connected to the micro-bump layer 40 by connectors 54 connected to the micro-bump line 46 and the micro-bump 48. An underfill 57 may fill the gap between the interposer 10 and the dies 56 and 58, covering the micro-bump line 46, the micro-bumps 48, and connectors 54.

As illustrated in FIGS. 2(a)-2(b), the interposer 10 may comprise a substrate 30. A conductive layer is formed as contact pads 32 on a surface of the substrate 30. There may be a plurality of contact pads 32 over the substrate 30. A plurality of TVs 303 may be formed through the substrate 30. A plurality of devices 305, either active or passive, may be formed within the substrate 30 as well. The interposer 10 may further comprise a passivation layer 34, an insulator layer 36, a RDL layer 38, and another insulator layer 37. An UBM layer 390 and UBM pads 391 are formed on the insulator layer 37, where the UBM pads 391 cover openings and on insulator layer 37.

The substrate 30 for the interposer 10 may be, e.g., a silicon substrate, doped or undoped, or an active layer of a silicon-on-insulator (SOI) substrate, used to provide support for the interposer 10. However, the substrate 30 may alternatively be a glass substrate, a ceramic substrate, a polymer substrate, or any other substrate that may provide a suitable protection and/or interconnection functionality. These and any other suitable materials may alternatively be used for the substrate 30.

A plurality of devices 305 may be formed within the substrate 30. As one of ordinary skill in the art will recognize, a wide variety of active devices and passive devices such as transistors, capacitors, resistors, inductors and the like may be used to generate the desired structural and functional requirements of the design for the interposer 10. The devices 305 may be formed using any suitable methods either within or else on the surface of the substrate 30.

However, as one of ordinary skill will recognize, the above described substrate 30 with devices 305 is not the only substrate that may be used. Alternative substrates, such as a package substrate or an interposer that does not have devices 305 therein, may alternatively be utilized. These substrates and any other suitable substrates may alternatively be used and are fully intended to be included within the scope of the present embodiments.

A plurality of TVs 303 may be formed through the substrate 30. The TVs 303 may be formed by applying and developing a suitable photoresist, and then etching the substrate 30 to generate TV openings. The openings for the TVs 303 may be formed to extend into the substrate 30 to a depth at least greater than the eventual desired height. Accordingly, the depth may be between about 1 µm and about 700 µm below the surface on the substrate 30. The openings for the TVs 303 may have a diameter of between about 1 µm and about 100 µm. Then the openings for the TVs 303 may be filled by a barrier layer and a conductive material, using a process such as chemical vapor deposition (CVD) process, plasma enhanced CVD (PECVD), sputtering or metal organic chemical vapor deposition (MOCVD). Excessive barrier layer and excessive conductive material outside of the openings for the TVs 303 may be removed through a grinding process such as chemical mechanical polishing (CMP). Afterwards, a thinning of the second side of the substrate 30 may be performed by a planarization process such as CMP or etching, in order to expose the openings for the TVs 303 and to form the TVs 303 from the conductive material that extends through the substrate 30.

A plurality of contact pads 32 may be formed on the substrate 30. Contact pads 32 may be made with aluminum (Al), copper (Cu), tin (Sn), nickel (Ni), gold (Au), silver (Ag), or other electrically conductive material. The deposition of contact pads 32 uses an electrolytic plating, sputtering, PVD, or electroless plating process. The size, shape, and location of the contact pads 32 are only for illustration purposes and are not limiting. The plurality of contact pads 32 may be of the same size or of different sizes.

A passivation layer 34 may be formed over the surface of the substrate 30 and above the contact pads 32 for structural support and physical isolation. The passivation layer 34 may be made with silicon nitride (SiN), silicon dioxide (SiO2), silicon oxynitride (SiON), polyimide (PI), benzocyclobutene (BCB), polybenzoxazole (PBO), or other insulating material. Openings of the passivation layer 34 may be made by removing a portion of the passivation layer 34 using a mask-defined photoresist etching process to expose the contact pads 32. The size, shape, and location of the openings made are only for illustration purposes and are not limiting.

An insulator layer such as a polymer layer 36 may be formed over the passivation layer 34 and over the passivation layer opening to cover the contact pads 32. An opening of the insulator layer 36 may be formed to expose the contact pads 32. The openings of the insulator layer 36 may be made by removing a portion of the insulator layer 36 using a mask-defined photoresist etching process to expose the contact pads 32. The size, shape, and location of the opening made are only for illustration purposes and are not limiting.

A RDL layer 38 may be formed following the contour of the insulator layer 36. The RDL layer 38 may be continuous and cover the exposed contact pads 32. While illustrated in FIG. 1(c) as a single layer of dielectric and interconnects, the RDL layer 38 may be formed of alternating layers of dielectric and conductive material and may be formed through any suitable process (such as deposition, damascene, dual damascene, etc.). The RDL layer 38 may be made with, e.g., Al, Cu, or a Cu alloy. The RDL layer 38 can be made by an electrolytic plating, sputter, PVD or electroless plating process. The RDL layer 38 can be made with a single layer, or multiple layers using an adhesion layer of Ti, TiW, TaN, Ta or Cr, for example. The interposer 10 may comprise a number of RDL layer to form a network of inter-level interconnects which may electrically connect to the contact pads 32 according to the function of the semiconductor device.

Another insulator layer 37 may be formed on the RDL layer 38, which may be the top layer and surface layer of the interposer 10. Openings of the insulator layer 37 may be formed to expose the RDL layer 38. The openings of the insulator layer 37 may be made by removing a portion of the insulator layer 37 using a mask-defined photoresist etching process to expose the RDL layer 38. The size, shape, and location of the opening made are only for illustration purposes and are not limiting. The insulator layer 37 may be made with silicon nitride (SiN), silicon dioxide (SiO2), silicon oxynitride (SiON), polyimide (PI), benzocyclobutene (BCB), polybenzoxazole (PBO), or other insulating material. The formation methods include spin coating or other commonly used methods. The thickness of the insulator layer 37 may be between about 5 µm and about 30 µm, for example. The dimensions recited throughout the description are merely examples, and will change with the down-scaling of integrated circuits.

An UBM layer comprising UBM pads 391 and UBM layer 390 may be formed. UBM pad 391 is formed around the openings of the insulator layer 37 and connected to the RDL layer 38, and UBM layer 390 is formed on insulator layer 37. The UBM pads 391 and the UBM layer 390 may be formed of copper or copper alloys, which may include silver, chromium, nickel, tin, gold, and combinations thereof. Additional layers, such as a nickel layer, a lead-free pre-solder layer, or the combinations thereof, may be formed over the copper layer. The UBM pads 391 and layer 390 may have a thickness of between about 1 µm and about 20 µm.

The interposer 10 described above may merely be an example of an embodiment. There may be many other variations of interposers different from what is illustrated in FIGS. 2(a)-2(b) and described above. For example, the insulator layer 36 may not present in some of the interposers, or there may be multiple passivation layers 34 or 37 in some embodiments of the interposers used in forming the package 100 shown in FIGS. 2(a)-2(b).

The dies 56 and 58 may be packaged with the interposer 10 through the micro-bump layer 40, and connectors 54, while the gap between the dies 56 and 58, and the interposer 10 is covered by an underfill 57. The dies 56 and 58 are connected to the connectors 54, which are placed on the micro-bump layer 40. The micro-bump layer 40 comprises a micro-bump 48 and a micro-bump line 42 or 46. Details of the micro-bump layer 40 have been discussed in greater details in FIGS. 1(b)-1(d).

Connectors 54 may be used to provide connections between the micro-bump layer 40 and a plurality of dies 56 and 58. The connectors 54 may be contact bumps such as micro-bumps or controlled collapse chip connection (C4) bumps and may comprise a material such as tin, or other suitable materials, such as silver or copper. In an embodiment in which the connectors 54 are tin solder bumps, the connectors 54 may be formed by initially forming a layer of tin through any suitable method such as evaporation, electroplating, printing, solder transfer, ball placement, etc., to a preferred thickness of about 100 µm. Once a layer of tin has been formed above the structure, a reflow may be performed in order to shape the material into the desired bump shape.

The underfill 57 may be used between the dies 56 and 58 and the interposer 10 to strengthen the attachment of the dies 56 and 58 to the interposer 10 and helps to prevent the thermal stresses from breaking the connections between the dies 56 and 58 and the interposer 10. Generally, the material for the underfill 57, such as organic resin, is selected to control the coefficient of thermal expansion and the shrinkage of underfill 57. Initially, liquid organic resin is applied that flows into the gap between the dies 56 and 58 and the surface of the interposer 10, which subsequently cures to control the shrinkage that occurs in underfill during curing.

FIGS. 3(a)-3(d) illustrate an embodiment of a method of forming a semiconductor device package with an interposer using a micro-bump layer, to form the device as illustrated in FIG. 2(a). One skilled in the art can easily use a similar process to form any other similar embodiments, which are not shown.

Figure 3A:
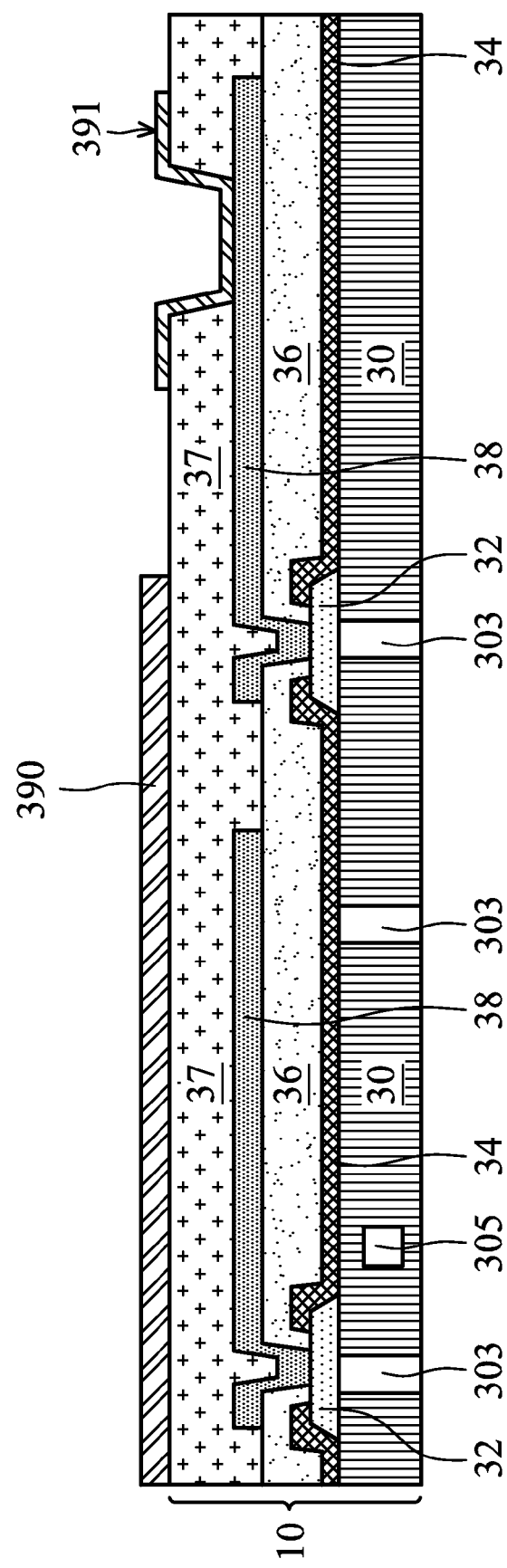
FIGS. 3(a)-3(d) illustrate cross-sectional views of a method of forming a package with an interposer using a micro-bump layer in accordance with some additional embodiments.

Illustrated in FIG. 3(a) is an interposer 10 as described in FIG. 2(a). The interposer 10 may comprise: a substrate 30 with TVs 303 and devices 305, a plurality of contact pad 32, a passivation layer 34, an insulator layer 36, a RDL 38, another insulator layer 37, and an UBM layer comprising UBM pads 391 formed covering openings of the insulator layer 37 and UBM layer 390 on insulator layer 37. Details of each layer and component of the interposer 10 have been described previously.

Figure 3B:
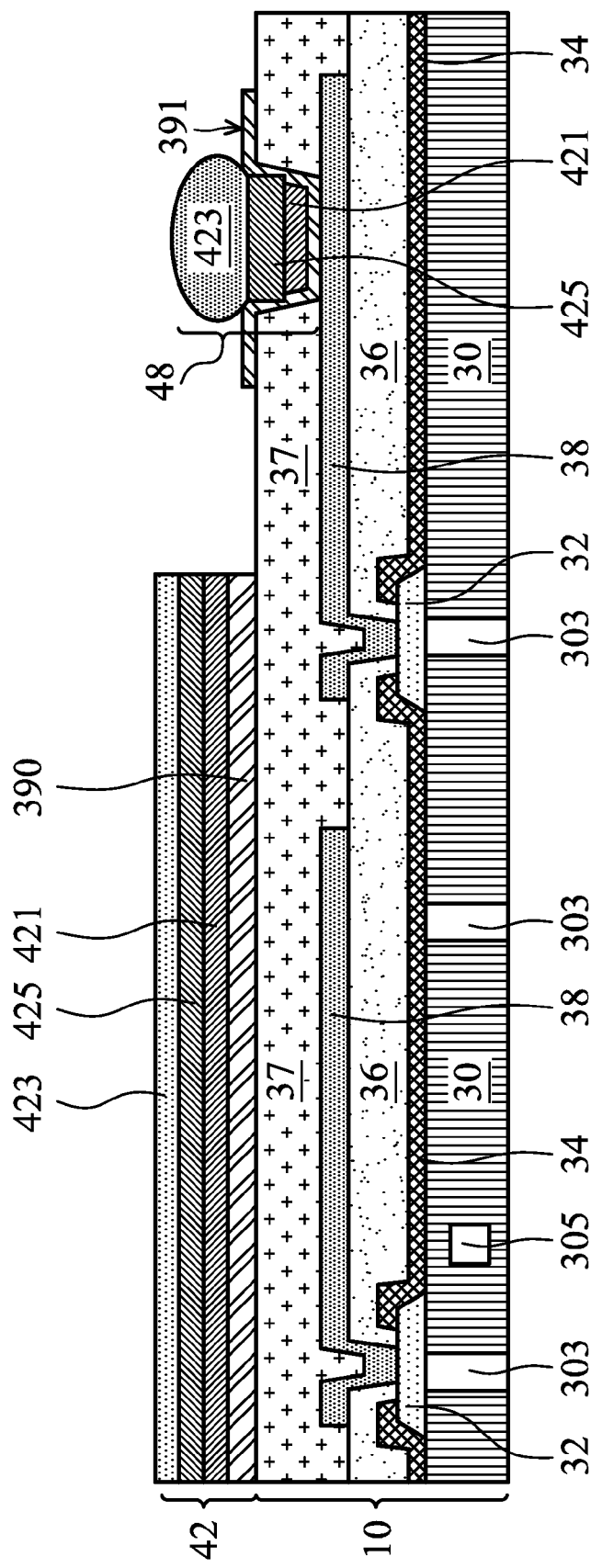

FIG. 3(b) illustrates the formation of the micro-bump layer 40, comprising a micro-bump line 42 and a micro-bump 48. The micro-bump 48 is connected to the UBM pad 391, which is further connected to TV 303, or device 305 of the interposer 10 by way of contact pad 32 and the RDL layer 38. The micro-bump line 42 is also placed on UBM layer 390, but on the insulator layer 37, which is insulated from any device or electrical connections of the interposer 10. The micro-bump layer 40 may be formed at a substantially same time, i.e., the micro-bump line 42 and the micro-bump 48 may be formed at a substantially same time to save costs. The micro-bump line 42 and the micro-bump 48 may be formed together, by plating of a 421 layer of Cu, a 425 layer of Ni, and a 423 layer of lead free solder such as SnAg in sequence. Each layer may be formed using a deposition process, such as sputtering, evaporation, electroplating, printing, solder transfer, and more. The layers 421, 423, and 425 for the micro-bump line 42 may be of a longer length than the layers 421, 423, and 425 of the micro-bump 48, because the micro-bump line 42 is used to make horizontal connections between a location of a first die to another location of the second die, and the micro-bump 48 is used to connect a die to the interposer in only one location.

Figure 3C:
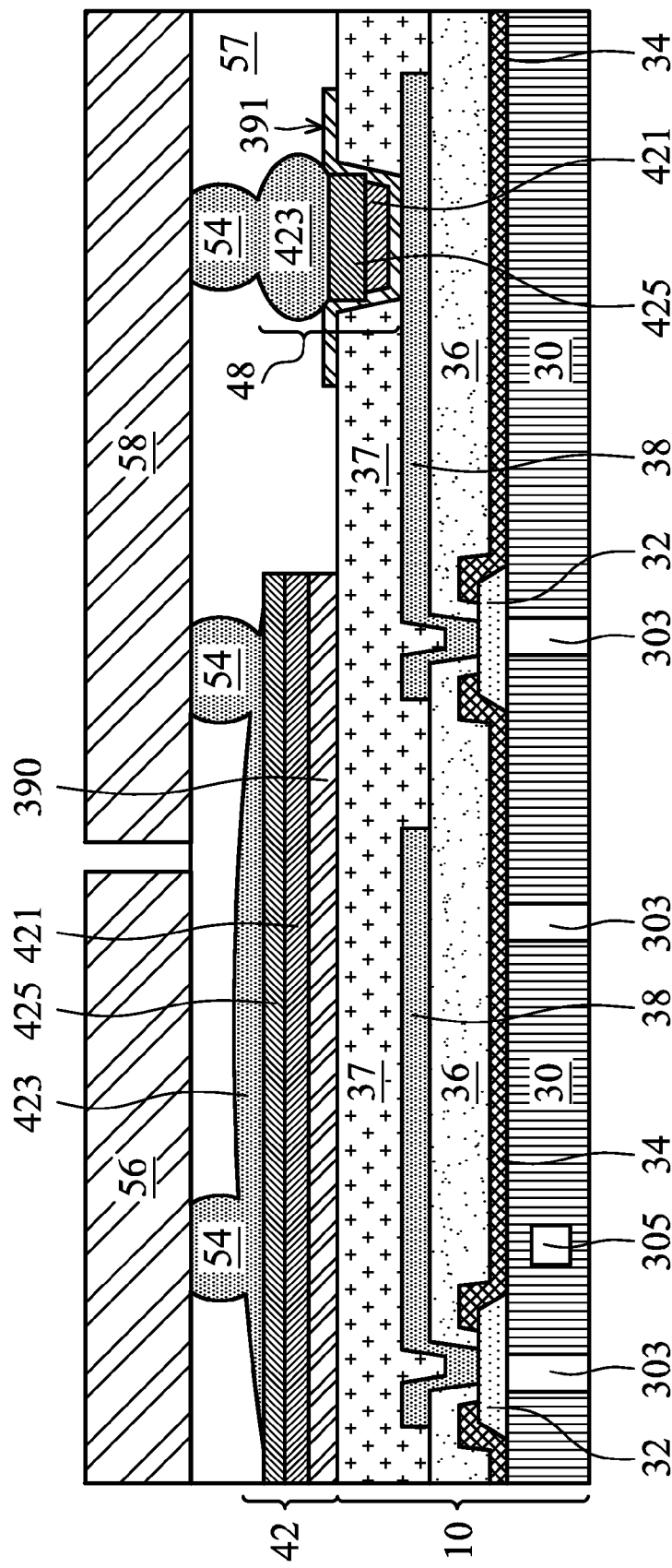

FIG. 3(c) illustrates the connection of the dies 56 and 58 to the micro-bump layer 40 using connectors 54 to form a package as shown in FIG. 2(a). The die 58 is placed above the micro-bump line 42. The connector 54 electrically connects the die 58 to the micro-bump line 42 at a first location of the die 58, and another connector 54 electrically connects the die 58 to the micro-bump 48 at a location different from the first location of the die 58. A second die 56 is placed above the micro-bump line 42, and electrically connected to the micro-bump line 42, therefore the micro-bump line 42 electrically connects the die 56 to the die 58 by way of connectors 54, without going through the interposer 10. After the dies 56 and 58 have been placed on the micro-bump 48 and the micro-bump line 42, a reflow may be performed. The reflow process changes the shape of the solder layer 423 into a circular shape for both the micro-bump 48 and the micro-bump line 42, but it would not affect the Cu layer 421 under the solder layer 423.

Figure 3D:
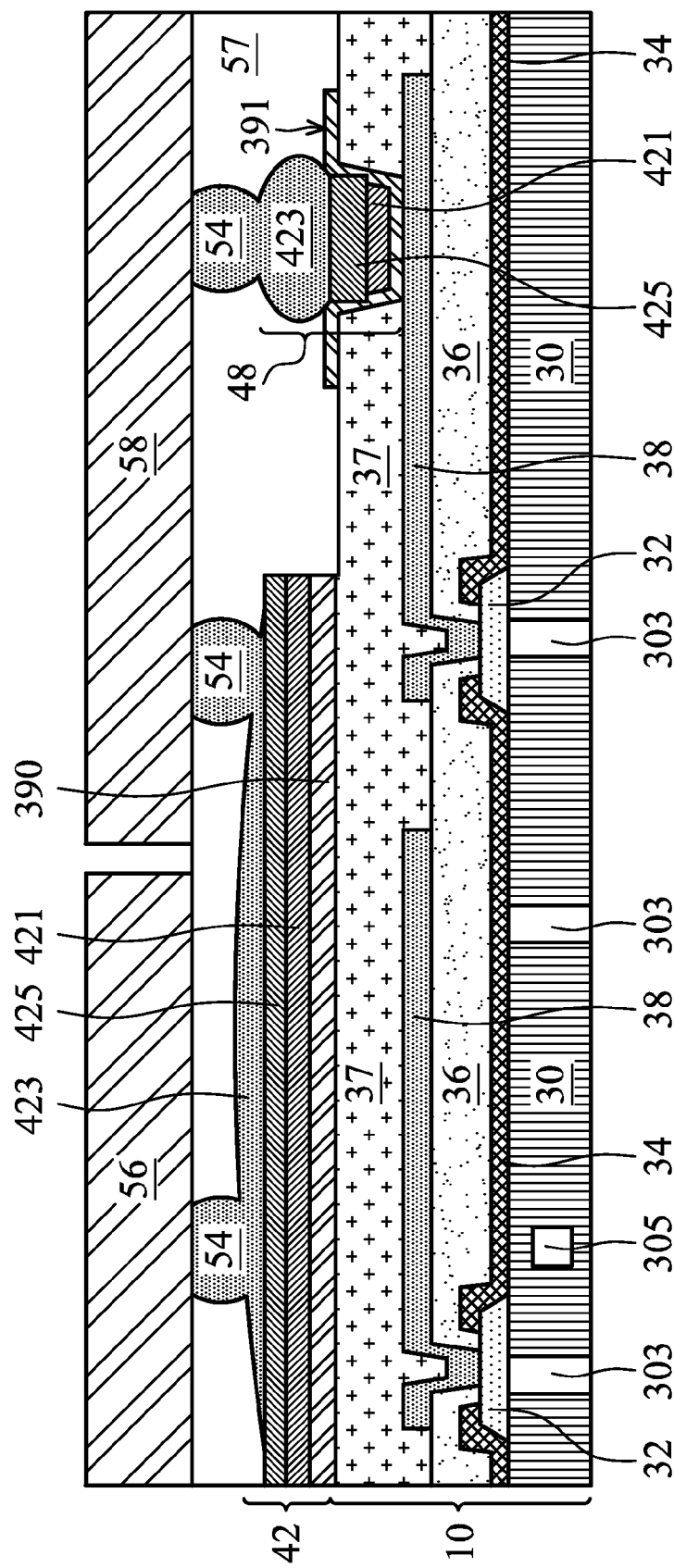

FIG. 3(d) illustrates an underfill 57 fills a gap between the micro-bump line 42, the micro-bump 48, and the dies 56 and 58. Generally, the material for the underfill 57, such as organic resin, is selected to control the coefficient of thermal expansion and the shrinkage of underfill 57. Initially, liquid organic resin is applied that flows into the gap between the dies 56 and 58 and the surface of the interposer 10, which subsequently cures to control the shrinkage that occurs in underfill during curing.

The process shown in FIGS. 3(a)-3(d) is only for illustration purposes, and are not limiting. There may be many variations of processing steps and processing materials that can be readily seen by those skilled in the art.

As illustrated above, methods and apparatus for forming a semiconductor device package on an interposer using a micro-bump layer are disclosed. The micro-bump layer may comprise micro-bumps and micro-bump lines, where a micro-bump line is used as a horizontal connection for signal transmission between different dies above the interposer and for signal transmission within the interposer as well. Comparing to metal lines within the interposer, the micro-bump lines above the interposer have much lower resistance and lower wiring density, therefore decrease interference and crosstalk, and improve signal integrity. The micro-bump lines may be formed at the same time as the formation of the micro-bumps with little or no additional cost.

A device for packaging IC chips is disclosed. The device comprises an interposer with a surface formed by an insulator layer, and a first contact pad covering an opening of the insulator layer and in contact with a metal layer within the interposer. The device further comprises a first die and a second die above the interposer. The device further comprises a micro-bump layer comprising a first micro-bump line above the insulator layer of the interposer and a micro-bump above the first contact pad of the interposer, wherein the first micro-bump line electrically connects the first die and the second die, and the micro-bump electrically connects the first die to the metal layer within the interposer.

A method of forming a packaging device is disclosed. The method comprises: providing an interposer with a surface formed by an insulator layer, and a contact pad covering an opening of the insulator layer and in contact with a metal layer within the interposer; forming a micro-bump layer above the interposer, wherein the micro-bump layer comprises a first micro-bump line above the insulator layer of the interposer, and a micro-bump connected to the contact pad of the interposer; placing a first die above the first micro-bump line, electrically connecting the first die to the first micro-bump line at a first location of the first die, and electrically connecting the first die to the micro-bump at a location different from the first location of the first die; and placing a second die above the first micro-bump line, and electrically connecting the second die to the first micro-bump line.

A device for packaging IC chips is disclosed. The device comprises an interposer with a surface formed by an insulator layer, comprising a first contact pad covering a first opening, a second contact pad covering a second opening, and a third contact pad covering a third opening of the insulator layer. The device further comprises a die above the interposer. The device further comprises a micro-bump layer comprising a first micro-bump line above the insulator layer of the interposer and a micro-bump above the first contact pad of the interposer, wherein the first micro-bump line electrically connects the second contact pad and the third contact pad, and the micro-bump connects the die to the first contact pad of the interposer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A device, comprising:
   an interposer with a surface formed by an insulator layer, and a first contact pad covering an opening of the insulator layer and in contact with a metal layer within the interposer;
   a first die and a second die above the interposer, wherein the first die is disposed laterally adjacent the second die; and
   a micro-bump layer comprising:
     a first micro-bump line above the insulator layer of the interposer, wherein electrical signals between the first die and the second die are transmitted through the first micro-bump line, and wherein the electrical signals transmitted between the first die and the second die through the first micro-bump line are not transmitted through the interposer; and
     a micro-bump above the first contact pad of the interposer, wherein the micro-bump electrically connects the first die to the metal layer within interposer.

2. The device of claim 1, wherein the insulator layer comprises a material selected from the group consisting essentially of silicon nitride (SiN), silicon dioxide (SiO2), silicon oxynitride (SiON), polyimide (PI), benzocyclobutene (BCB), polybenzoxazole (PBO), other insulating material, or combinations thereof.

3. The device of claim 1, wherein the micro-bump and the first micro-bump line are formed of a same material.

4. The device of claim 3, wherein the micro-bump and the first micro-bump line each comprise:
   a layer of copper;
   a layer of nickel over the layer of copper; and
   a layer of solder material over the layer of nickel.

5. The device of claim 1, wherein the micro-bump and the first micro-bump line are of a substantially similar height.

6. The device of claim 1, wherein the first micro-bump line comprises a layer of copper and a layer of solder material.

7. The device of claim 6, wherein the first micro-bump line further comprises a layer of Ni placed between the layer of copper and the layer of solder material.

8. The device of claim 1, wherein the micro-bump layer is of a height from about 5 µm to about 50 µm.

9. The device of claim 1, wherein the micro-bump layer further comprises a second micro-bump line above the insulator layer electrically connecting a plurality of dies above the interposer.

10. The device of claim 1, further comprising an under bump metal (UBM) layer between the insulator layer and the first micro-bump line.

11. The device of claim 1, wherein the micro-bump layer further comprises a third micro-bump line above the insulator layer connected to a second contact pad and a third contact pad, wherein the second contact pad covers a different opening of the insulator layer and in contact with a metal layer within the interposer, and the third contact pad covers a different opening of the insulator layer and in contact with a metal layer within the interposer.

12. The device of claim 1, wherein the interposer further comprises a passivation layer and a redistribution layer.

13. The device of claim 1, wherein the first micro-bump line is connected to the first die by way of a connector, and an underfill fills a gap between the first micro-bump line and the first die.

14. A device, comprising:
   an interposer with a surface formed by an insulator layer, comprising a first contact pad covering a first opening, a second contact pad covering a second opening, and a third contact pad covering a third opening of the insulator layer;
   a first die above the interposer;
   a second die above the interposer and adjacent the first die; and
   a micro-bump layer comprising a micro-bump line above the insulator layer of the interposer and a micro-bump above the first contact pad of the interposer, wherein electrical signals between the second contact pad and the third contact pad are transmitted through the micro-bump line, wherein the micro-bump line is electrically connected to the first die and the second die only through the second contact pad and the third contact pad, and wherein the micro-bump connects the die to the first contact pad of the interposer.

15. The device of claim 14, wherein the insulator layer comprises a material selected from the group consisting essentially of silicon nitride (SiN), silicon dioxide (SiO2), silicon oxynitride (SiON), polyimide (PI), benzocyclobutene (BCB), polybenzoxazole (PBO), other insulating material, or combinations thereof.

16. The device of claim 14, wherein the micro-bump and the micro-bump line are formed of a same material.

17. The device of claim 14, wherein the micro-bump and the micro-bump line are of a substantially similar height.

18. A device, comprising:
   an interposer comprising an insulator layer at a top surface;
   a contact pad over the insulator layer;
   a micro-bump line on the contact pad, wherein the micro-bump line comprises a continuous solder layer having a first solder ball and a second solder ball;
   a first die over the micro-bump line; and
   a second die over the micro-bump line and laterally adjacent the first die, wherein electrical signals between the first die and the second die are transmitted through the micro-bump line without being transmitted through the interposer.

19. The device of claim 18, wherein the first solder ball is bonded to the first die and the second solder ball is bonded to the second die.

20. The device of claim 18, wherein the insulator layer contacts an entire bottom surface of the contact pad.

* * * * *